United States Patent
Kanasugi et al.

(10) Patent No.: US 7,661,361 B2
(45) Date of Patent: Feb. 16, 2010

(54) PRINTING AND DRYING METHOD, METHOD OF PRODUCTION OF ELECTRONIC DEVICE, AND PRINTING AND DRYING SYSTEM

(75) Inventors: Masaaki Kanasugi, Chuo-ku (JP); Tamotsu Ishiyama, Chuo-ku (JP); Shigeki Sato, Chuo-ku (JP); Masahiro Karatsu, Chuo-ku (JP); Tsuneo Suzuki, Chuo-ku (JP)

(73) Assignee: TDK Corporation, Tokyo (JP)

( * ) Notice: Subject to any disclaimer, the term of this patent is extended or adjusted under 35 U.S.C. 154(b) by 489 days.

(21) Appl. No.: 11/387,715

(22) Filed: Mar. 24, 2006

(65) Prior Publication Data

US 2006/0213382 A1    Sep. 28, 2006

(30) Foreign Application Priority Data

Mar. 28, 2005  (JP)  ............................. 2005-092762
Jan. 23, 2006  (JP)  ............................. 2006-014364

(51) Int. Cl.
*B41L 35/14* (2006.01)

(52) U.S. Cl. ...................................... 101/488; 101/487
(58) Field of Classification Search ................. 101/488, 101/487
See application file for complete search history.

(56) References Cited

U.S. PATENT DOCUMENTS 4,569,584 A * 2/1986 St. John et al. .............. 399/301
6,336,406 B1 * 1/2002 Wakabayashi et al. ...... 101/483
7,316,184 B2 * 1/2008 Schneider et al. ......... 101/424.1
7,332,432 B2 * 2/2008 Nakamura et al. .......... 438/677
2002/0033106 A1 * 3/2002 Ohba et al. ................. 101/225
2003/0091751 A1 * 5/2003 Tsuruta et al. .............. 427/487

FOREIGN PATENT DOCUMENTS

| JP | A 56-094719 | 7/1981 |
| JP | A 03-074820 | 3/1991 |
| JP | A 09-106925 | 4/1997 |
| JP | A 2001-237140 | 8/2001 |
| JP | A 2004-144433 | 5/2004 |

* cited by examiner

*Primary Examiner*—Anthony H. Nguyen
(74) *Attorney, Agent, or Firm*—Oliff & Berridge, PLC

(57) ABSTRACT

A printing and drying method comprising laying a support sheet 20 elongated in the long direction so as to bridge both a printing zone 42 and a drying zone 44, in the printing zone 42, giving the support sheet 20 a first tension F1, in that state, printing the support sheet 20 with predetermined patterns, then feeding the support sheet 20 toward the drying zone 44, in the drying zone 44, giving the support sheet 20 on which the predetermined patterns were printed a second tension F2, and in that state, drying it in a drying chamber 62. The first tension F1 and the second tension F2 are given by separate tension giving means, and the second tension F2 is tension given along the support sheet 20 in the long direction and able to prevent shrinkage of the support sheet 20 in the long direction while passing through the drying zone 44.

9 Claims, 10 Drawing Sheets

FIG.2
(A)
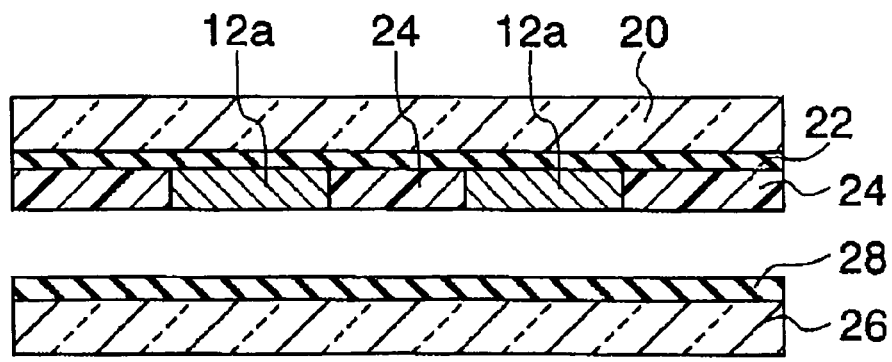
(B)
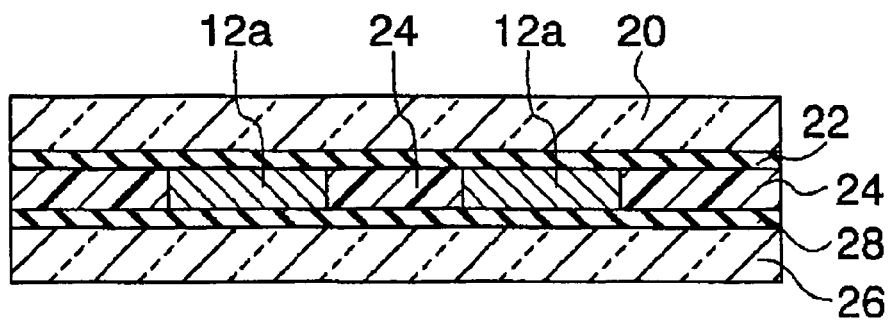
(C)
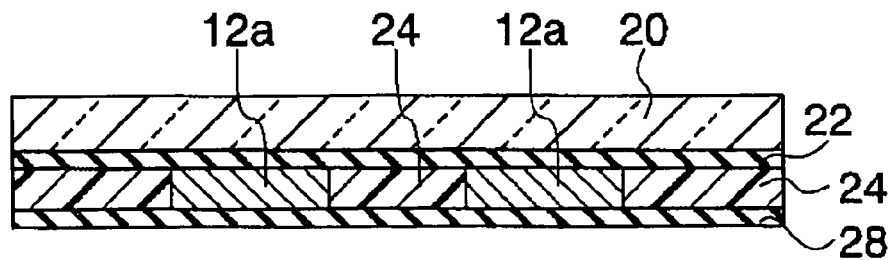

FIG.3
(A)
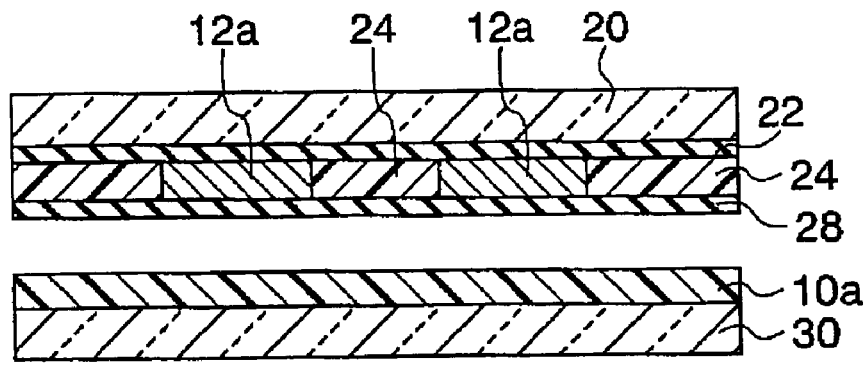
(B)
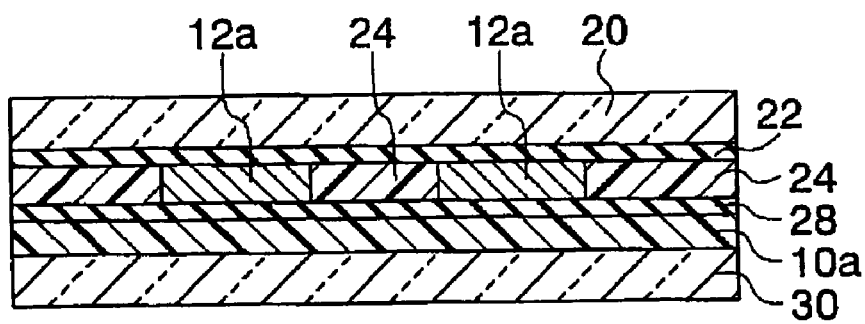
(C)
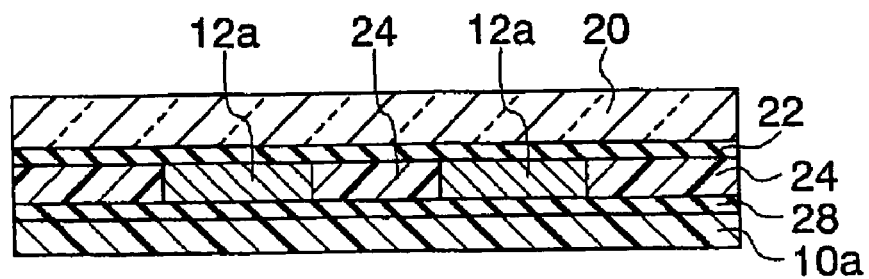

PRINTING AND DRYING METHOD, METHOD OF PRODUCTION OF ELECTRONIC DEVICE, AND PRINTING AND DRYING SYSTEM

BACKGROUND OF THE INVENTION

1. Field of the Invention

The present invention relates to a printing and drying method, a method of production of an electronic device, and a printing and drying system, more particularly relates to a printing and drying method and a printing and drying system enabling overlapping printing of complementary type patterns on a support sheet with little positional deviation when for example producing a multilayer ceramic capacitor or other electronic device.

2. Description of the Related Art

For example, when producing a multilayer ceramic capacitor or other electronic device, as shown in FIG. 10, sometimes a support sheet constituted by the carrier sheet 20 is formed on its surface with a release layer 22 which in turn is formed over it with predetermined patterns of an electrode layer 12a by printing. Alternatively, sometimes a carrier sheet 20 is formed on its surface with a ceramic green sheet which in turn is formed on its surface with predetermined patterns of an electrode layer 12a by printing.

After this, sometimes the clearance parts between the predetermined patterns of the electrode layer 12a are formed with patterns of a type complementary with the electrode layer 12a constituted by a blank pattern layer 24 by the printing method again. In the state with no blank pattern layer 24 formed, if stacking a large number of green sheets and electrode layers, step differences will occur between the parts with no electrode layers and parts with electrode layers. Due to this, sheet delamination, stack deformation, etc. become problems. For this reason, recently, as shown in Documents 1 to 4 (Japanese Patent Publication (A) No. 56-94719, Japanese Patent Publication (A) No. 3-74820, Japanese Patent Publication (A) No. 9-106925, and Japanese Patent Publication (A) No. 2001-237140), to deal with the increase in the number of layers and the reduction in the layer thicknesses, the method of forming a pattern layer comprised of a dielectric paste similar to the green sheet at the blank pattern parts where no electrode layer is formed has been proposed.

However, in the conventional printing and drying method, when printing and drying an electrode layer 12a on the green sheet or release layer at the surface of the carrier sheet 20, the heat at the time of drying sometimes causes the polyethylene terephthalate forming the carrier sheet 20 to end up stretching along the long direction. This is probably because the carrier sheet 20 is a drawn film. The heat at the time of drying probably ends up causing shrinking along the long direction.

For this reason, in the next step, if forming the blank pattern layer 24 by printing by the design dimensions, as shown in FIG. 10, it was found that the blank pattern layer 24 was liable to be printed deviated in position. In particular, due to the patterns of the electrode layer 12a being made finer and thinner, the positional deviation at the time of printing causes sheet delamination, stack deformation, and other problems after the subsequent stacking step.

Note that Document 5 (Japanese Patent Publication (A) No. 2004-144433) discloses a drying method measuring the change in dynamic pressure of the flow of air at the inlet of the drying oven and preventing uneven drying etc. However, with the method shown in this Document 5, it was not possible to prevent deformation of the support sheet due to the heat inside the drying chamber and was not possible to prevent positional deviation or dimensional deviation at the time of printing.

SUMMARY OF THE INVENTION

The present invention was made in consideration of this situation and has as its object to provide a printing and drying method and a printing and drying system able to suppress deformation of the support sheet due to the heat inside the drying chamber and as a result able to suppress positional deviation at the time of printing and further being superior in work efficiency.

Another object of the present invention is to provide a method of production of an electronic device making stacking deviation of the internal electrode layers and/or blank pattern layers difficult even with increasing reduction of size or reduction of thickness, suppressing sheet delamination, stack deformation, etc., suppressing variations in electrostatic capacity or other properties, and improving the production yield.

To achieve the above objects, the printing and drying method according to the present invention is a printing and drying method comprising laying a support sheet elongated in the long direction so as to bridge both a printing zone and a drying zone, in the printing zone, giving the support sheet a first tension and in that state printing that support sheet with predetermined patterns, then feeding the support sheet toward the drying zone, and, in the drying zone, giving the support sheet printed with the predetermined patterns a second tension and in that state drying in a drying chamber, characterized in that the first tension and second tension are given by separate tension giving means and in that the second tension is tension which is given to the support sheet along the long direction and can prevent shrinkage of the support sheet in the long direction while passing through the drying zone.

The printing and drying system according to the present invention is a printing and drying system enabling a support sheet elongated in the long direction to be laid bridging both a printing zone and a drying zone, the printing zone being provided with a first tension giving means giving the support sheet a first tension, a printing means printing a support sheet to which the first tension is given with print patterns, and a first conveying means for feeding the support sheet toward the drying zone, the drying zone being provided with a second tension giving means giving the support sheet on which the predetermined patterns are printed a second tension, a heating means giving the support sheet a predetermined temperature in the state with that second tension given, and a second conveying means making the heated support sheet move in the drying chamber along the support sheet in the long direction, the second tension given by the second tension giving means being tension given along the support sheet in the long direction and able to prevent shrinkage of the support sheet in the long direction while passing through the drying zone.

In the printing and drying method and printing and drying system according to the present invention, the support sheet bridges both the printing zone and drying zone. Therefore, printing and drying can be conducted consecutively on the support sheet and the work efficiency is superior.

Further, in the present invention, the first tension and second tension are given by separate tension giving means, and the second tension is tension given along the support sheet in the long direction and able to prevent shrinkage of the support sheet in the long direction while passing through the drying zone. Therefore, in the drying zone, even if the support sheet is heated, the support sheet is kept from shrinking in the long direction. As a result, positional deviation of the print patterns printed on the support sheet becomes harder to occur.

For this reason, when initial print patterns initially printed on the support sheet are formed with separate print patterns by the printing method, positional deviation between the patterns becomes harder to occur.

Therefore, by using the printing and drying method of the present invention to form the surface of the support sheet with internal electrode patterns or blank patterns of an electronic device and produce a multilayer ceramic capacitor or other electronic device, it is possible to easily produce an electronic device of reduced size and reduced thickness.

That is, even if the size is reduced or the thickness is reduced, stacking deviation of the internal electrode layers and/or blank pattern layers becomes harder to occur, sheet delamination, stack deformation, etc. can be suppressed, and variations in electrostatic capacity or other properties can be suppressed. Further, in the present invention, printing and drying can be consecutively conducted and the production yield of electronic devices can be improved.

Note that in the present invention, at least initially, when printing and drying the internal electrode layer or blank pattern layer, it is sufficient to give the second tension. After this, when printing and drying the next patterns, it is sufficient to use the ordinary drying method without giving second tension. However, even when printing and drying the next patterns, it is more preferable to employ the method of the present invention.

Preferably, the first tension is tension given to the support sheet in the long direction and is of an extent not allowing the support sheet to wrinkle. At the time of printing, if the support sheet wrinkles, the printing cannot be performed, so at the time of printing, the support sheet is kept from wrinkling by giving the first tension. The first tension per unit width of the support sheet is preferably 0.28 to 0.83 N/cm.

Preferably, the second tension per unit width of the support sheet is 0.16 to 1.22 N/cm along the support sheet in the long direction. If this second tension is too small, the action and effect of the present invention are small. If this second tension is too large, this second tension tends to cause the support sheet to deform under heat and the print patterns to become larger in positional deviation. Therefore, the above range is preferable.

Preferably, in the drying zone, the second tension given the support sheet positioned in the drying zone is detected and the second tension is controlled to be held constant.

In the printing and drying system of the present invention, the drying zone is preferably provided with a second tension detecting means for detecting a second tension given to the support sheet positioned in the drying zone and a control means for controlling the second tension giving means so that the second tension is maintained constant based on a signal detected by the second tension detecting means.

In accordance with the composition of the support sheet, the width of the support sheet, the drying temperature, etc., the optimum second tension able to suppress heat deformation of the support sheet changes. Therefore, by controlling the second tension to become constant, heat deformation of the support sheet can be effectively suppressed.

Preferably, the printing zone and drying zone are provided between them with a first buffer zone, and, in that first buffer zone, the support sheet is given slack so as to allow index feeding of the support sheet in the printing zone and continuous feeding of the support sheet in the drying zone. By configuring the system in this way, printing and drying can be consecutively conducted, stable control of tension can be realized, and heat deformation of the support sheet etc. can be suppressed, so the work efficiency is improved.

Preferably, in a predetermined range of length from the inlet of the drying zone to the inside of the drying zone, contact of a guiding means with the support sheet is reduced or the guiding means is prevented from contacting it.

In the past, the support sheet inside the drying chamber was conveyed from the inlet to the outlet of the drying chamber by a guide belt conveyor. However, depending on the composition etc. of the electrode paste for forming the print patterns, the electrode patterns easily unevenly dry and extremely thin parts of printing thickness end up occurring. When the electrode layer is thin, the parts of uneven thickness of the electrode layer are liable to cause short-circuit defects, nonlamination, or other inconveniences.

The inventors discovered that uneven drying of the electrode patterns causes mainly contact between the guide belt conveyor and support sheet near the inlet of the drying chamber. Therefore, the inventors discovered that by reducing the contact of the guiding means with the support means or preventing the guiding means from contacting it in a predetermined range of length from the inlet of the drying zone toward the inside of the drying zone, the above inconvenience can be eliminated.

Further, the inventors discovered from experiments that by configuring the system so that the metal sheet contact the support sheet in a predetermined range of length from the inlet of the drying zone toward the inside of the drying zone as well, substantially similar effects can be obtained.

Note that in the present invention, the predetermined range of length, while depending on the conveying speed of the support sheet, drying conditions, etc. in the drying zone, is preferably 1.8 to 2.5 m.

Preferably, when designating the glass transition temperature of the synthetic resin forming the support sheet as Tg, in the drying zone, the support sheet is exposed to a temperature of $\{Tg-15\}°$ C. or more and further a temperature of $\{Tg+25\}°$ C. or less.

When this temperature is low, the time required for drying becomes longer and the print patterns are left undried. If the drying temperature becomes too high, the deformation of the support sheet due to the heat becomes too great, so this is unpreferable.

When the support sheet is comprised of polyethylene terephthalate etc., preferably, in the drying zone, the support sheet is exposed to a temperature environment of 70 to 100° C.

The present invention is particularly effective when the support sheet is a drawn synthetic resin sheet. That is, this is because when a drawn synthetic resin sheet, heat deformation easily occurs at the drying temperature in the drying chamber.

Preferably, the support sheet passing through the drying zone is fed into a takeup zone, the support sheet is taken up on a takeup roller, the drying zone and the takeup zone are provided between them with a second buffer zone, and a third tension different from the second tension given to the support sheet in the drying zone can be given at the takeup zone.

When the tension given to the support sheet in the takeup zone is the same as the second tension given in the drying zone, the tension is relatively too low. When the takeup roller takes up the support sheet, buckling, takeup slip, etc. easily occur. Therefore, by giving a third tension different from the second tension given to the support sheet in the drying zone in the takeup zone, when taking up the support sheet by the takeup roller, buckling, takeup slip, etc. are liable to occur.

Preferably, the takeup zone is provided with a destaticizer which removes static electricity of the support sheet passing through the takeup zone. By removing the static electricity, the support sheet can be prevented from deposition of dust etc. and defects due to the deposition of dust or other foreign matter can be prevented.

Preferably, the third tension per unit width of the support sheet is 0.5 to 0.8 N/cm along the support sheet in the long direction. When in this range of tension, buckling, takeup slip, etc. can be prevented when the takeup roller takes up the support sheet.

Preferably, the third tension per unit width of the support sheet is controlled to be substantially constant regardless of the takeup diameter of the takeup roller. By this control, it is possible to prevent buckling, takeup slip, etc. regardless of the takeup diameter of the takeup roller.

BRIEF DESCRIPTION OF THE DRAWINGS

Below, the present invention will be explained based on the embodiments shown in the drawings, wherein FIG. 2(A) to FIG. 2(C) and FIG. 3(A) to FIG. 3(C) are sectional views of principal parts showing a step of stacking green sheets and electrode layers.

DESCRIPTION OF THE PREFERRED EMBODIMENTS

First Embodiment

Overall Configuration of Multilayer Ceramic Capacitor

First, as a first embodiment of an electronic device according to the present invention, the overall configuration of a multilayer ceramic capacitor will be explained.

Figure 1:
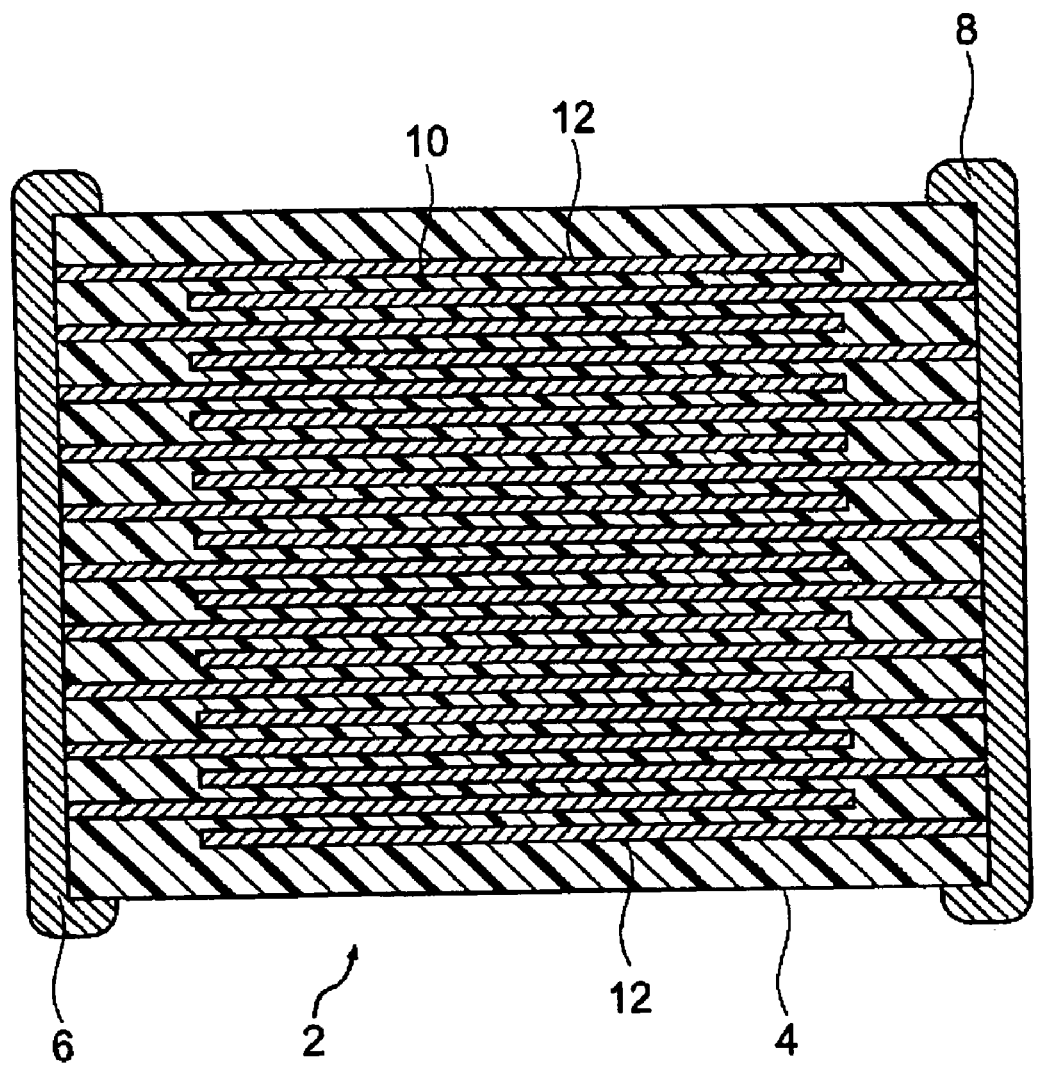
FIG. 1 is a schematic sectional view of a multilayer ceramic capacitor produced by a method of production of an electronic device according to an embodiment of the present invention.

As shown in FIG. 1, the multilayer ceramic capacitor 2 according to the present embodiment has a capacitor body 4, first end electrode 6, and second end electrode 8. The capacitor body 4 has dielectric layers 10 and internal electrode layers 12. Between the dielectric layers 10, these internal electrode layers 12 are alternately stacked. One of each two alternately stacked internal electrode layers 12 is electrically connected to the inside of a first end electrode 6 formed at the outside of one end of the capacitor body 4. Further, the other of each two alternately stacked internal electrode layers 12 is electrically connected to the inside of a second end electrode 8 formed at the outside of the other end of the capacitor body 4.

In the present embodiment, the internal electrode layers 12 are formed by the transfer method as explained in detail later.

The dielectric layer 10 is not particularly limited in material and for example is formed by calcium titanate, strontium titanate, and/or barium titanate or another dielectric material. Each dielectric layer 10 is not particularly limited in thickness, but is generally several μm to several hundred μm. In particular, in the present embodiment, it is reduced in thickness to preferably 5 μm or less, more preferably 3 μm or less, particularly preferably 1.5 μm or less.

The end electrodes 6 and 8 are not particularly limited in material, but usually copper, a copper alloy, nickel, a nickel alloy, etc. is used. Silver or an alloy of silver and palladium etc. may also be used. The end electrodes 6 and 8 are also not particularly limited in thickness, but usually are about 10 to 50 μm or so thick.

The shape and size of the multilayer ceramic capacitor 2 may be suitably determined in accordance with the objective or application. When the multilayer ceramic capacitor 2 is parallelepiped in shape, it is usually a length of (0.6 to 5.6 mm, preferably 0.6 to 3.2 mm)×width of (0.3 to 5.0 mm, preferably 0.3 to 1.6 mm)×thickness (0.1 to 1.9 mm, preferably 0.3 to 1.6 mm) or so.

Method of Production of Multilayer Ceramic Capacitor

Next, an example of a method of production of a multilayer ceramic capacitor 2 according to the present embodiment will be explained.

(1) First, to produce the ceramic green sheet forming the dielectric layers 10 shown in FIG. 1 after firing, a dielectric paste (green sheet paste) is prepared.

The dielectric paste is comprised of an organic solvent-based paste obtained by kneading a dielectric material (ceramic powder) and an organic vehicle.

The dielectric material may be suitably selected from various types of compounds forming composite oxides or oxide, for example, carbonates, nitrates, hydroxides, organometallic compounds, etc. and mixed for use. The dielectric material is usually used as a powder having an average particle size of 0.4 μm or less, preferably 0.1 to 3.0 μm or so. Note that to form an extremely thin green sheet, it is preferable to use a powder of a particle size smaller than the green sheet thickness.

The organic vehicle is comprised of a binder resin dissolved in an organic solvent. As the binder resin used in the organic vehicle, in the present embodiment, a polyvinyl butyral resin is used. The polyvinyl butyral resin has a polymerization degree of 1000 to 1700, preferably 1400 to 1700. Further, the resin has a butyralation degree of 64% to 78%, preferably 64% to 70%, while the amount of residual acetyl groups is less than 6%, preferably 3% or less.

The polyvinyl butyral resin can be measured for polymerization degree by, for example, the polymerization degree of the material polyvinyl acetal resin. Further, the butyralation degree can be measured, for example, based on JIS K6728. Further, the amount of the residual acetyl groups can be measured based on JIS K6728.

The organic solvent used in the organic vehicle is not particularly limited, for example, terpineol, alcohol, butyl carbitol, acetone, toluene, or another organic solvent is used. In the present embodiment, the organic solvent preferably includes an alcohol-based solvent and an aromatic-based solvent. When the total weight of the alcohol-based solvent and the aromatic-based solvent is 100 parts by weight, the aromatic-based solvent is included in an amount of 10 parts by weight to 20 parts by weight. If the content of the aromatic-based solvent is too small, the roughness of the sheet surface tends to increase. If too large, the paste filtration property deteriorates and the sheet surface increases in roughness and deteriorates.

As the alcohol-based solvent, methanol, ethanol, propanol, butanol, etc. may be illustrated. As the aromatic-based solvent, toluene, xylene, benzyl acetate, etc. may be illustrated.

The binder resin is dissolved in advance in at least one type or more of an alcohol-based solvent selected from methanol, ethanol, propanol, and butanol and filtered to obtain a solution. The solution preferably has a dielectric powder or other ingredient added to it. A high polymerization degree binder resin has a hard time dissolving in a solvent. With the ordinary method, the paste tends to deteriorate in dispersability. In the method of the present embodiment, the high polymerization degree binder resin is dissolved in a good solvent explained above, then the solution has a ceramic powder or other ingredient added to it, so it is possible to improve the paste dispersability and the formation of undissolved resin can be suppressed. Note that with a solvent other than the above solvents, the solid content concentration cannot be raised and the aging of the lacquer viscosity tends to increase.

The dielectric paste may contain, in accordance with need, additives selected from various types of dispersants, plasticizers, destaticization agents, dielectrics, glass frit, insulators, etc.

This dielectric paste is formed using the doctor blade method etc., for example as shown in FIG. 3(A), on a second support sheet constituted by the carrier sheet 30 to a thickness of preferably 0.5 to 30 μm, more preferably 0.5 to 10 μm or so, so as to form a green sheet 10a. The green sheet 10a is dried after being formed on the carrier sheet 30. The drying temperature of the green sheet 10a is preferably 50 to 100° C., while the drying time is preferably 1 to 20 min. The thickness of the green sheet 10a after drying shrinks by a thickness of 5 to 25% compared with before drying. The thickness of the green sheet after drying is preferably 3 μm or less.

(2) Separate from the above carrier sheet 30, as shown in FIG. 2(A), a first support sheet constituted by a carrier sheet 20 is prepared, is formed over it with a release layer 22, and is formed over it with predetermined patterns of an electrode layer 12a. Around that, the parts of the surface of the release layer 22 on which the electrode layer 12a is not formed are formed with a blank pattern layer 24 of substantially the same thickness as the electrode layer 12a.

As the carrier sheets 20 and 30, for example PET (polyethylene terephthalate) films etc. are used. To improve the peelability, sheets on which silicone etc. are coated are preferable. These carrier sheets 20 and 30 are not particularly limited in thickness, but preferably are 5 to 100 μm. These carrier sheets 20 and 30 may be the same or different in thickness.

The release layer 22 preferably includes dielectric particles the same as the dielectric forming the green sheet 10a shown in FIG. 3(A). Further, this release layer 22 includes, in addition to the dielectric particles, a binder, plasticizer, and release agent. The dielectric particles may be the same in size as the dielectric particles included in the green sheet, but ones which are smaller is preferable.

The method of coating the release layer 22 is not particularly limited, but it is necessary to form the layer extremely thin. For example, the coating method using a wire bar coater or die coater is preferable.

The binder for the release layer 22, for example, is comprised of an organic binder or emulsion of an acryl resin, polyvinyl butyral, polyvinyl acetal, polyvinyl alcohol, polyolefin, polyurethane, polystyrene, or copolymers of the same. The binder included in the release layer 22 may be the same or different from the binder included in the green sheet 10a, but the same one is preferable.

The plasticizer for the release layer 22 is not particularly limited, but for example a phthalic acid ester, dioctyl phthalate, adipic acid, a phosphoric acid ester, glycols, etc. may be mentioned. The plasticizer included in the release layer 22 may be the same or different from the plasticizer included in the green sheet 10a.

The release agent for the release layer 22 is not particularly limited, but for example paraffin, wax, silicone oil, etc. may be mentioned. The release agent included in the release layer 22 may be the same or different as the release agent included in the green sheet 10a.

The binder is included in the release layer 22 in an amount, with respect to 100 parts by weight of the dielectric particles, of preferably 2.5 to 200 parts by weight, more preferably 5 to 30 parts by weight, particularly preferably 8 to 30 parts by weight or so.

The plasticizer is included in the release layer 22 in an amount, with respect to 100 parts by weight of the binder, of 0 to 200 parts by weight, preferably 20 to 200 parts by weight, more preferably 50 to 100 parts by weight.

The release agent is included in the release layer 22 in an amount, with respect to 100 parts by weight of the binder, of 0 to 100 parts by weight, preferably 2 to 50 parts by weight, more preferably 5 to 20 parts by weight.

The release layer 22 is formed on the surface of the carrier sheet 30, then, as shown in FIG. 2(A), the release layer 22 is formed on its surface with the electrode layer 12a forming the internal electrode layer 12 after firing in predetermined patterns. The electrode layer 12a has a thickness of preferably 0.1 to 2 μm, more preferably 0.1 to 1.0 μm or so. The electrode layer 12a may be comprised of a single layer or may be comprised of a plurality of layers different in composition.

The electrode layer 12a is formed on the surface of the release layer 22 by a thick film-forming method using an electrode paste. One type of thick film method, the screen printing method or the gravure printing method, is used to form the electrode layer 12a on the surface of the release layer 22 as follows.

First, the electrode paste is prepared. The electrode paste is prepared by kneading a conductive material comprised of various types of conductive metals or alloys or various oxides, organometallic compounds, resinates, etc. forming the above conductive materials after firing and an organic vehicle.

As the conductive material used when producing the electrode paste, Ni or an Ni alloy or a mixture of the same is used. This conductive material is not particularly limited in shape and may be spherical, flake shaped, etc. Further, it may also be mixtures of these shapes. Further, the conductive material used should be one with an average particle size of usually 0.1 to 2 μm, preferably 0.2 to 1 μm or so.

The organic vehicle includes a binder and solvent. As the binder, for example, ethyl cellulose, acryl resin, polyvinyl butyral, polyvinyl acetal, polyvinyl alcohol, polyolefin, polyurethane, polystyrene, or copolymers of the same etc. may be mentioned, but in particular polyvinyl butyral or another butyral-based binder is preferable.

The binder is included in the electrode paste in an amount, with respect to 100 parts by weight of the conductive material (metal powder), of preferably 8 to 20 parts by weight. As the solvent, for example, terpineol, butyl carbitol, kerosene, or another known one may be used. The solvent content is preferably, with respect to the entire paste, preferably 20 to 55 wt % or so.

To improve the bondability, the electrode paste preferably contains a plasticizer. As the plasticizer, benzylbutyl phthalate (BBP) or another phthalic acid ester, adipic acid, phosphoric acid ester, glycols, etc. may be mentioned. The plasticizer is included in the electrode paste in an amount, with respect to 100 parts by weight of the binder, of preferably 10 to 300 parts by weight, more preferably 10 to 200 parts by weight. Note that if the amount of addition of the plasticizer or adhesive is too great, the electrode layer 12a tends to remarkably decline in strength. Further, to improve the transferability of the electrode layer 12a, the electrode paste preferably has a plasticizer and/or adhesive added to it so as to improve the bondability and/or adhesiveness of the electrode paste.

After or before the release layer 22 is formed on its surface with predetermined patterns of an electrode paste layer by the printing method, the parts of the surface of the release layer 22 where no electrode layer 12a is formed are formed with a blank pattern layer 24 of substantially the same thickness as the electrode layer 12a.

The blank pattern layer 24 shown in FIG. 2(A) can be formed on the surface of the release layer 22 by a printing method using a blank pattern paste or other thick film-forming method. When using one of the thick film methods, the screen printing method, a blank pattern layer on the surface of the release layer 22 (FIG. 2(A)) is formed as follows.

First, the blank pattern paste is prepared. The blank pattern paste is comprised of an organic solvent-based paste obtained by kneading a dielectric material (ceramic powder) and an organic vehicle.

As the dielectric material used when producing a blank pattern paste, a dielectric comprised of dielectric particles the same as the dielectric forming the green sheet 10a and having the same average particle size is fabricated. The blank pattern paste contains dielectric particles (ceramic powder) in an amount, with respect to the paste as a whole, of 30 to 50 parts by weight, more preferably 40 to 50 parts by weight. If the content of the ceramic powder is too small, the paste viscosity becomes small and printing becomes difficult. Further, if the percent content of the ceramic powder is too great, the printing thickness tends to be difficult to reduce.

The organic vehicle contains a binder and solvent. As the binder, for example, ethyl cellulose, acryl resin, polyvinyl butyral, polyvinyl acetal, polyvinyl alcohol, polyolefin, or their copolymers etc. may be mentioned, but in particular polyvinyl butyral or another butyral-based binder is preferable.

The butyral-based binder contained in this blank pattern paste has a polymerization degree set to at least the polymerization degree of the binder contained in the paste for forming the green sheet 10a, preferably higher. For example, when the polyvinyl butyral included in the green sheet paste as the binder has a polymerization degree of 1000 to 1700, the binder contained in the blank pattern paste is polyvinyl butyral or polyvinyl acetal having a polymerization degree of 1400 or more, more preferably 1700 or more, particularly preferably 2400 or more. Among these, polyvinyl acetal having a polymerization degree of 2000 or more is preferable.

When the binder of the blank pattern paste is polyvinyl butyral, one with a butyralation degree of 64 to 74 mol % in range is preferable. Further, when polyvinyl acetal, the acetalation degree is preferably 66 to 74 mol %.

The binder is included in the blank pattern paste in an amount, with respect to 100 parts by weight of the dielectric material, of preferably 3 to 10 parts by weight, more preferably, 4 to 8 parts by weight.

For the solvent, for example, terpineol, butyl carbitol, kerosene, or another known solvent may be used. The solvent content is preferably 50 to 70 parts by weight with respect to the entire paste.

Further, the blank pattern paste may also contain various types of additives such as a dispersant, plasticizer and/or adhesive, and destaticization agent.

The dispersant is not particularly limited, but, for example, a high molecular weight material such as an ester-based polymer or a carboxylic acid may be used. The content is, with respect to 100 parts by weight of the ceramic powder, preferably 0.25 to 1.5 parts by weight, more preferably 0.5 to 1.0 part by weight.

The plasticizer is not particularly limited, but, for example, benzylbutyl phthalate (BBP) or another phthalic acid ester, adipic acid, phosphoric acid ester, glycols, etc. may be used. The content, with respect to 100 parts by weight of the binder, is preferably 10 to 200 parts by weight, more preferably 50 to 100 parts by weight.

The destaticization agent is not particularly limited, but, for example, an imidazoline-based destaticization agent etc. is used. The content is preferably, with respect to 100 parts by weight of the ceramic powder, 0.1 to 0.75 part by weight, more preferably 0.25 to 0.5 part by weight.

This blank pattern paste, as shown in FIG. 2(A), is printed at the blank pattern parts between the parts of the electrode layer 12a. Then, the electrode layer 12a and blank pattern layer 12a are dried in accordance with need. The drying temperature is not particularly limited, but is preferably 70 to 120° C., while the drying time is preferably 0.5 to 5 min.

(3) Separate from the above carrier sheets 20 and 30, as shown in FIG. 2(A), a bonding layer transfer sheet comprised of a third support sheet constituted by the carrier sheet 26 formed on its surface with a bonding layer 28 is prepared. The carrier sheet 26 is comprised of a sheet similar to the carrier sheets 20 and 30.

The bonding layer 28 has a composition similar to that of the release layer 22 except for not including a release agent. That is, the bonding layer 28 includes a binder and a plasticizer. The bonding layer 28 may also contain dielectric particles the same as the dielectric forming the green sheet 10a, but when forming a bonding layer with a thickness less than the particle size of the dielectric particles, it is better not to include dielectric particles. Further, when the bonding layer 28 contains dielectric particles, the dielectric particles preferably have a size smaller than the size of the dielectric particles included in the green sheet.

The plasticizer is preferably included in the bonding layer 28 in an amount, with respect to 100 parts by weight of the binder, of 0 to 200 parts by weight, preferably 20 to 200 parts by weight, more preferably 50 to 100 parts by weight.

The bonding layer 28 preferably further includes a destaticization agent. The destaticization agent includes one of the imidazoline-based surfactants. The weight-based amount of addition of the destaticization agent is preferably an amount of addition based on the weight of the binder (organic polymer material) or less. That is, the destaticization agent is preferably included in the bonding layer 28 in an amount, with respect to 100 parts by weight of the binder, of 0 to 200 parts by weight, preferably 20 to 200 parts by weight, more preferably 50 to 100 parts by weight.

The bonding layer 28 has a thickness of preferably 0.02 to 0.3 μm or so. Preferably, the thickness is less than the average particle size of the dielectric particles included in the green sheet. Further, the bonding layer 28 preferably has a thickness of 1/10 or less than the thickness of the green sheet 10a.

If the bonding layer 28 is too thin, the bonding strength will fall. If too thick, clearances will easily form inside the sintered device body according to the thickness of the bonding layer. The electrostatic capacity tends to remarkably drop by that amount of volume.

The bonding layer 28 is formed on the surface of the third support sheet constituted by the carrier sheet 26 by for example the bar coater method, die coater method, reverse coater method, dip coater method, kiss coater method, or other method and dried in accordance with need. The drying temperature is not particularly limited, but preferably is room temperature to 80° C., while the drying time is preferably 1 to 5 min.

(4) To form the bonding layer on the surface of the electrode layer 12a and blank pattern layer 24 shown in FIG. 2(A), in the present embodiment, the transfer method is employed. That is, as shown in FIG. 2(B), the bonding layer 28 of the carrier sheet 26 is, as shown in FIG. 2(B), pressed against the surfaces of the electrode layer 12a and blank pattern layer 24 and hot pressed, then the carrier sheet 26 is peeled off so as to, as shown in FIG. 2(C), transfer the bonding layer 28 to the surface of the electrode layer 12a and blank pattern layer 24. Note that the bonding layer 28 may also be transferred to the surface of the green sheet 10a shown in FIG. 3(A).

The heating temperature at the time of transfer is preferably 40 to 100° C. Further, the pressing force is preferably 0.2 to 15 MPa. The pressing may be pressing by a press or pressing by a calendar roller, but use of a pair of rollers is preferable.

After this, the electrode layer 12a is adhered to the surface of the green sheet 10a formed on the surface of the carrier sheet 30 shown in FIG. 3(A). For this reason, as shown in FIG. 3(B), the electrode layer 12a and blank pattern layer 24 of the carrier sheet 20 are pressed via the bonding layer 28 against the surface of the green sheet 10a together with the carrier sheet 20 and are hot pressed to, as shown in FIG. 3(C), transfer the electrode layer 12a and blank pattern layer 24 to the surface of the green sheet 10a. However, since the carrier sheet 30 on the green sheet side is peeled off, if seen from the green sheet 10a side, the green sheet 10a is transferred to the electrode layer 12a and blank pattern layer 24 via the bonding layer 28.

The heating and pressing at the time of this transfer may be pressing and heating by a press or pressing and heating by a calendar roller, but use of a pair of rollers is preferable. The heating temperature and pressing force are similar to when transferring the bonding layer 28.

By the steps shown in FIG. 2(A) to FIG. 3(C), a single green sheet 10a is formed with a single layer of predetermined patterns of an electrode layer 12a. A large number of green sheets 10a formed with the electrode layers 12a are stacked until the necessary number of layers so as to form a stack.

(5) Then, the stack is cut into a predetermined size to form a green chip. This green chip is treated to remove the binder and to fire it, then the dielectric layers are made to oxidize again by heat treatment.

The treatment to remove the binder may be performed under ordinary conditions, but when using Ni, an Ni alloy, or another base metal for the conductive material of the internal electrode layers, it is particularly preferably performed under the following conditions.

Rate of temperature rise: 5 to 300° C./hour,
Holding temperature: 200 to 400° C.,
Holding time: 0.5 to 20 hours,
Atmosphere: mixed gas of wet $N_2$ and $H_2$ As the firing conditions, the following conditions are preferable.

Rate of temperature rise: 50 to 500° C./hour,
Holding temperature: 1100 to 1300° C.,
Holding time: 0.5 to 8 hours,
Cooling rate: 50 to 500° C./hour,
Atmosphere gas: mixed gas of wet $N_2$ and $H_2$ etc.

However, the oxygen partial pressure in air atmosphere at the time of firing is preferably $10^{-2}$ Pa or less, particularly $10^{-2}$ to $10^{-8}$ Pa. If over the range, the internal electrode layers tend to oxidize. Further, if the oxygen partial pressure is too low, the electrode material of the internal electrode layers undergoes abnormal sintering and tends to end up breaking.

The heat treatment after this firing is preferably performed by making the holding temperature or highest temperature preferably 1000° C. or more, more preferably 1000 to 1100° C. If the holding temperature or highest temperature at the time of heat treatment is less than this range, the dielectric material becomes insufficiently oxidized, so tends to become shorter in insulation resistance life. If over the range, the Ni of the internal electrodes oxidizes and the capacity falls. Not only this, it ends up reacting with the dielectric material, so the life also tends to become shorter. The oxygen partial pressure at the time of the heat treatment is an oxygen partial pressure higher than the reducing atmosphere at the time of firing, preferably $10^{-3}$ Pa to 1 Pa, more preferably $10^{-2}$ Pa to 1 Pa. If less than this range, reoxidation of the dielectric layers 10 is difficult. If over this range, the internal electrode layers 12 tend to oxidize.

The thus obtained sintered body (device body 4) may be for example end polished by barrel polishing, sandblasting, etc. and baked with end electrode paste to form end electrodes 6 and 8. The firing conditions of the end electrode paste are preferably, for example, a mixed gas of wet $N_2$ and $H_2$, 600 to 800° C., and 10 minute to 1 hour or so. Further, in accordance with need, the end electrodes 6, 8 are plated etc. to form pad layers. Note that the end electrode paste may be prepared in the same way as the above electrode paste.

The thus produced multilayer ceramic capacitor of the present invention is mounted by soldering etc. on a printed circuit board etc. and used for various types of electronic equipment etc.

Printing and Drying Method and Printing and Drying System

Figure 4:
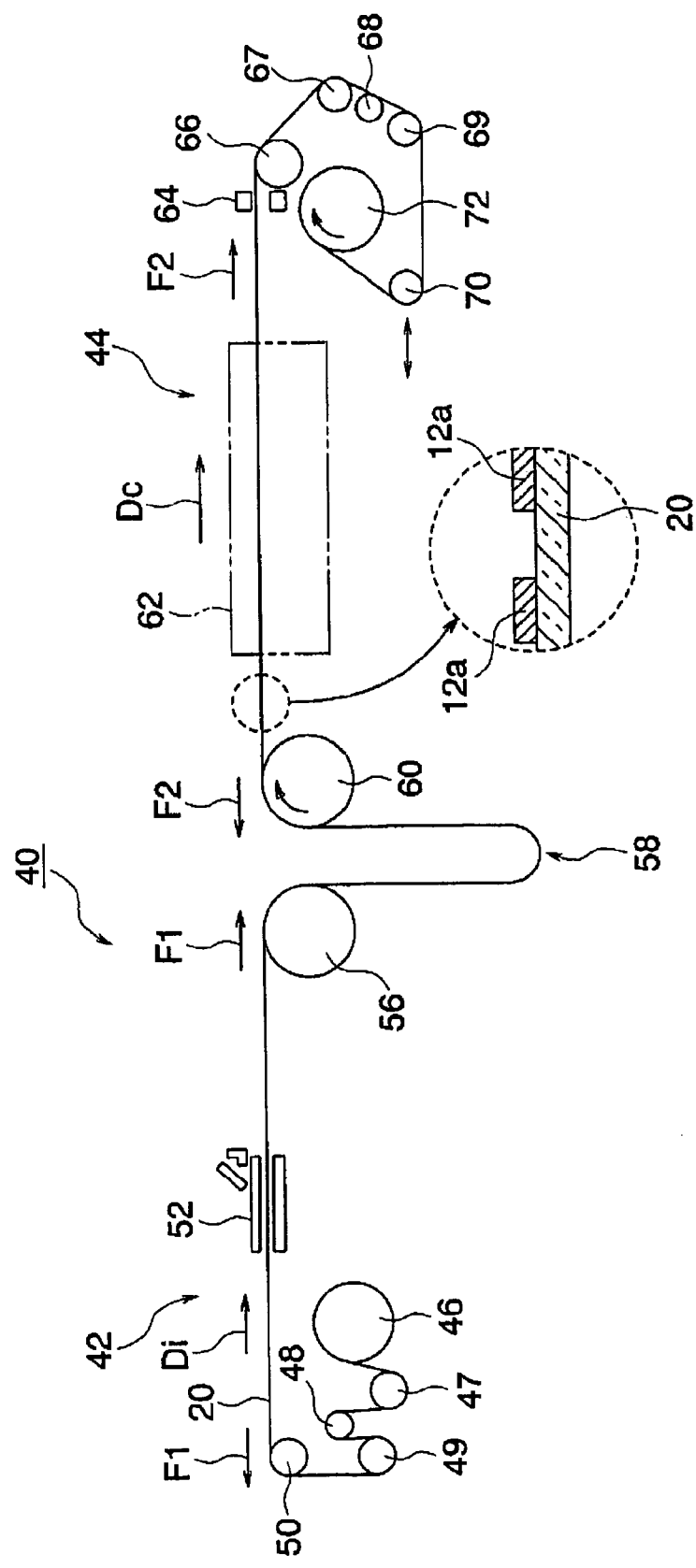
FIG. 4 is an overall view of the configuration of a printing and drying method according to an embodiment of the present invention.

In the method of production of the above multilayer ceramic capacitor 2, when forming the electrode layer 12a in predetermined patterns by the printing method on the surface of the release layer 22 of the support sheet constituted by the carrier sheet 20 shown in FIG. 2(A), the printing and drying system 40 shown in FIG. 4 according to the embodiment of the present invention is used.

The printing and drying system 40 has a printing zone 42 and a drying zone 44. The printing zone 42 and the drying zone 44 are provided between them with a first buffer zone 58. The support sheet constituted by the carrier sheet 20 extends so as to bridge the printing zone 42 and the drying zone 44. That is, the carrier sheet 20 fed from the feed roller 46 finally is taken up by the takeup roller 72.

In the printing zone 42, the sheet 20 fed from the feed roller 46 is passed through the rollers 47 to 50 and conveyed to the screen printer (printing means) 52. At the screen printer 52, the green sheet or release layer of the surface of the sheet 20 is screen printed with an electrode layer 12a. Note that sheet 20 is formed on its surface, as shown in FIG. 2(A), with a release layer 22 in advance.

The sheet 20 on which the printer 52 screen prints the electrode layer 12a is then fed to the inspection unit, then is passed over the roller 56 and fed to the first buffer zone 58. The roller 56 is for example a suction roller and can hold the back surface of the sheet 20 by suction. The roller 56 is repeatedly controlled to alternately turn and stop. While the printer 52 is printing, the roller 56 is stopped and the roller 49 functions as a dancer roller. At the time of printing, the sheet 20 is given a first tension F1 along its long direction.

The first tension F1 is tension of an extent not allowing the sheet 20 to wrinkle etc. during the printing, specifically is preferably 0.28 to 0.83 N/cm per unit width of the sheet 20. The width of the sheet 20 is the direction perpendicularly intersecting the long direction of the sheet. In FIG. 4, it is the direction perpendicular to the paper surface.

The roller 56 functioning as a suction roller and the roller 49 functioning as a dancer roller correspond to the first tension giving means. Further, the roller 56 corresponds to the first conveying means.

When the printing is finished, the roller 56 turns and the sheet 20 is index fed by exactly the length of the printer 52 in the index feed direction Di. The sheet 20 index fed by the roller 56 is made slack at the buffer part 58 and repeatedly hangs down between the rollers 56 and 60.

The drying zone 44 is provided with a drying chamber 62. Inside the drying chamber 62, a not shown drying heating means is attached. The drying heating means is not particularly limited, but a ceramic heater, drying hot air blowing system, etc. may be illustrated. The inside of the drying chamber is held at a predetermined drying temperature. The drying temperature inside the drying chamber 62 is preferably 70 to 100° C.

The sheet 20, in the present embodiment, is comprised of a drawn PET film. The glass transition temperature Tg is about 78° C. The drying temperature linked with the glass transition temperature Tg is preferably a temperature of $\{Tg-8\}°$ C. or more and, further, a temperature of $\{Tg+22\}°$ C. or less.

The sheet 20 with the electrode layer 12*a* dried inside the drying chamber 62 then passes through the EPC detector 64 and EPC drive roller 66, then is taken up through the rollers 67 to 70 at the takeup roller 72. When being taken up on the takeup roller 72, the electrode layer 12*a* is positioned at the outside when the sheet 20 is taken up.

The EPC detector 64 detects the undulating state of the sheet 20. Based on the results of detection, the EPC drive roller 66 corrects undulation of the sheet 20. The roller 67 detects the second tension F2 in the long direction acting on the sheet 20 in the drying zone 44. The detected results are sent to a not shown control means. Based on the detection signal, the rotation of the takeup roller 72 is controlled and the second tension F2 acting on the sheet 20 is controlled to be constant. Note that the roller 70 functions as a dancer roller and has the function of making the roller 70 move in the horizontal direction to hold the holding angle of the takeup part constant.

In the present embodiment, the roller 60 functions as a suction roller and holds the sheet 20 by suction from the back surface to prevent slip. The roller 60 and the roller 72 function as second tension giving means. Further, the roller 67 functions as a second tension detecting means. By the takeup roller 72 rotating in synchronization with the roller 60 and controlling the rotation, in the drying zone 44, the sheet 20 is sent continuously in the continuous feed direction Dc without stopping in the state with a constant second tension F2 given.

The second tension is set to a tension able to prevent shrinkage of the sheet 20 in the long direction when passing through the drying zone, in particular the inside of the drying chamber 62. In accordance with the composition of the sheet 20, width of the sheet 20, the drying temperature inside the drying chamber 62, etc., the optimum second tension able to suppress heat deformation of the sheet 20 changes. In the present embodiment, the second tension F2 per unit width is preferably 0.16 to 1.22 N/cm.

If this second tension F2 is too small, the action and effect of the present invention are small. If this second tension F2 is too large, this second tension F2 tends to cause the sheet 20 to deform under heat and positional deviation of the print patterns to become larger. Therefore, the above range is preferable.

In the present embodiment, the second tension F2 actually acting by the roller 67 is detected. That tension F2 is made to become a constant numerical value in the above range by controlling the roller 72 to control the tension F2. For this reason, heat deformation of the sheet 20 can be effectively suppressed.

The index feed direction Di in the printing zone 42 and the continuous feed direction Dc in the drying zone 44 are the same direction. At the printing zone 42, the sheet is index fed, while at the drying zone 44, it is continuously fed. For this reason, these zones are provided between them with a first buffer zone 58. By providing the first buffer zone 58, the printing and drying can be consecutively performed and the work efficiency is improved.

Figure 5:
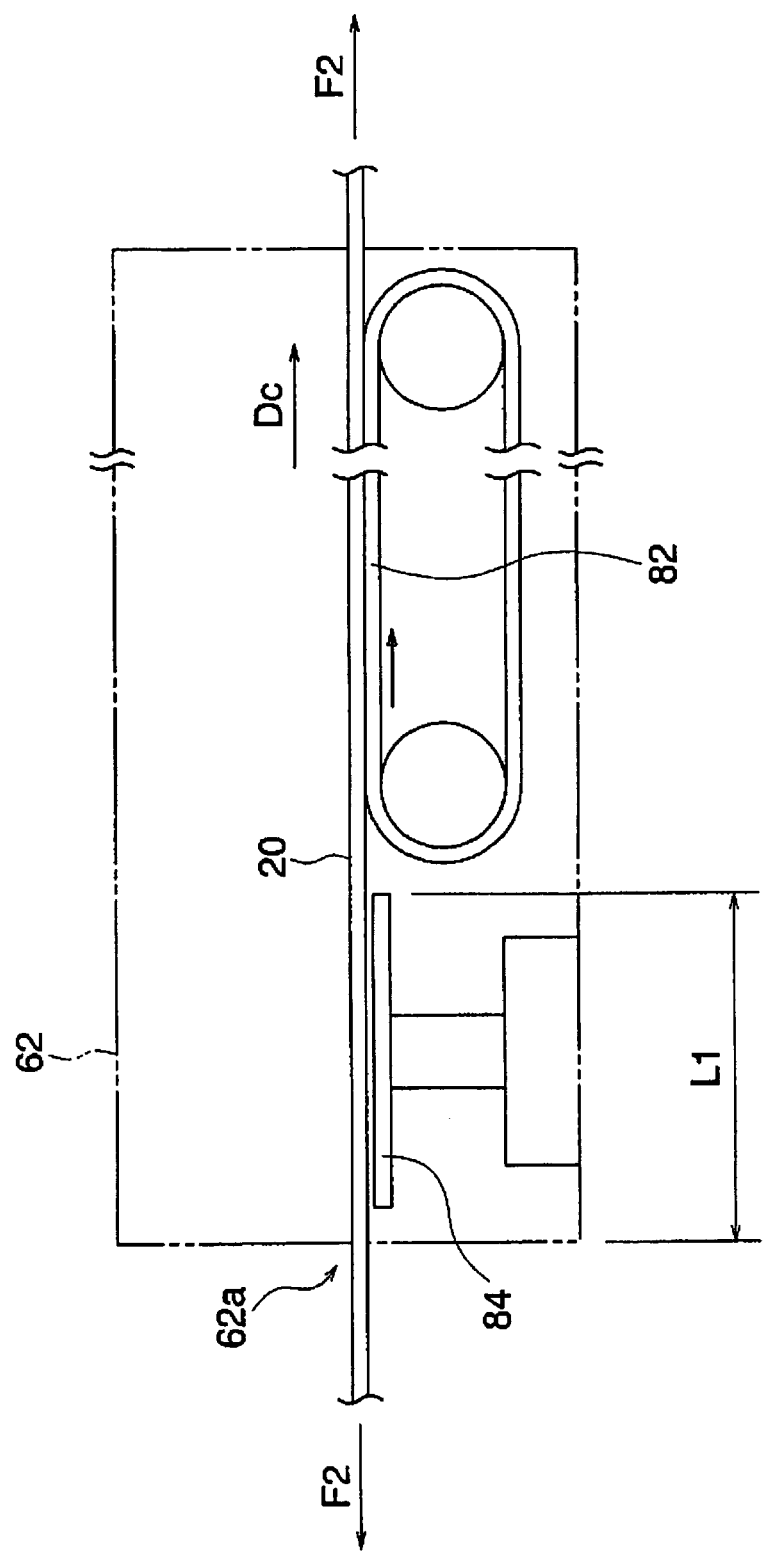
FIG. 5 is an enlarged schematic view of a drying zone shown in FIG. 4.

As shown in FIG. 5, inside the drying chamber 62, a guide means constituted by a belt conveyor 82 is arranged. The inside of the drying chamber 62 is long along the feed direction, so if there is no conveyor 82, even with the second tension F2, the sheet 20 ends up becoming slack and the sheet can no longer be fed well along the direction of progression.

However, in the present embodiment, inside the drying chamber 62, the belt conveyor 82 is not arranged along the entire length of the feed direction of the drying chamber 62. A metal sheet 84 is arranged fixed at a predetermined range of length L1 from the inlet 62*a* of the drying chamber 62 to the feed direction Dc. This supports the sheet 20 from the bottom and enables sliding movement in the direction of progression Dc.

The material of the metal sheet 84 is not particularly limited, but preferably aluminum, iron, stainless steel, etc. may be illustrated. The metal sheet 84 is preferably polished on the surface to improve its slip property. Alternatively, it may be lined by a fluororesin etc. to improve the slip property. The metal sheet 84 is not particularly limited in width, but is preferably wider than the sheet 20. The length of the metal sheet 84 in the feed direction is about the same extent as the length L1.

The predetermined range of length L1 is preferably 1.8 to 2.5 m. If this length is too small and the electrode layer 12*a* is thin, the print patterns tend to easily unevenly dry. If too long, the friction with the sheet 20 on the metal sheet 84 becomes too large and tends to obstruct feed of the sheet 20.

The reason why arranging the metal sheet 84 in the predetermined range of length L1 can prevent uneven drying is not necessarily clear, but with this range of length L1, the electrode layer 12*a* is half dried. If the belt conveyor 82 contacts the sheet 20 in this range, it is believed that the drying becomes uneven. As opposed to this, with contact with the metal sheet 84, it is believed that uneven drying can be suppressed. This fact is confirmed by experiments of the inventors.

The total length of the drying chamber 62 in the feed direction is not particularly limited, but is a length of about 1 to 5 times the range of length L1, specifically, 4 to 8 m. The feed rate of the sheet 20 is preferably 3 to 12 m/min. The time during which the sheet 20 passes through the inside of the drying chamber 62 is 0.3 min to 4 min or so.

Note that when arranging the belt conveyor 82 along the entire length of the drying chamber 62 in the feed direction, as a simple means, a metal sheet 84 is inserted over the conveyor 82 in a range of a length L1 and may be prevented from moving relative to the conveyor 82 by fixing the metal sheet 84 with respect to the drying chamber 62. In this case as well, in a range of a length L1 from the inlet 62a, the back surface of the sheet 20 no longer contacts the conveyor 82.

In the printing and drying method and printing and drying system 40 according to the present embodiment, the sheet 20 bridges both the printing zone 42 and the drying zone 44. Therefore, the sheet 20 can be consecutively printed on and dried and the work efficiency is superior.

Further, the first tension F1 and the second tension F2 are given by separate tension giving means, and the second tension F2 is tension given along the sheet 20 in the long direction and able to prevent shrinkage of the sheet 20 in the long direction while passing through the drying chamber 62. For this reason, even if the sheet 20 is heated in the drying chamber 62, the sheet 20 is kept from shrinking in the long direction. As a result, positional deviation of the dried print patterns of the electrode layer 12a printed on the sheet 20 becomes harder to occur.

Therefore, when the print patterns of the electrode layer 12a first printed on the sheet 20 are, as shown in FIG. 2(A), formed with separate print patterns constituted by the blank pattern layer 24 by the printing method, positional deviation between patterns becomes harder to occur.

Therefore, by using this printing and drying method to form patterns of the electrode layer 12a or a blank pattern layer 24 on the surface of the sheet 20 so as to produce a multilayer ceramic capacitor shown in FIG. 1, it becomes possible to easily produce a smaller and thinner multilayer ceramic capacitor 2. That is, even if made smaller or thinner, stacking deviation of the internal electrode layers and/or blank pattern layers becomes harder to occur, sheet delamination, stack deformation, etc. can be suppressed, and variations in the electrostatic capacity or other properties can be suppressed. Further, in the present embodiment, printing and drying can be consecutively performed and the production yield of multilayer ceramic capacitors can be improved.

Second Embodiment

Figure 6:
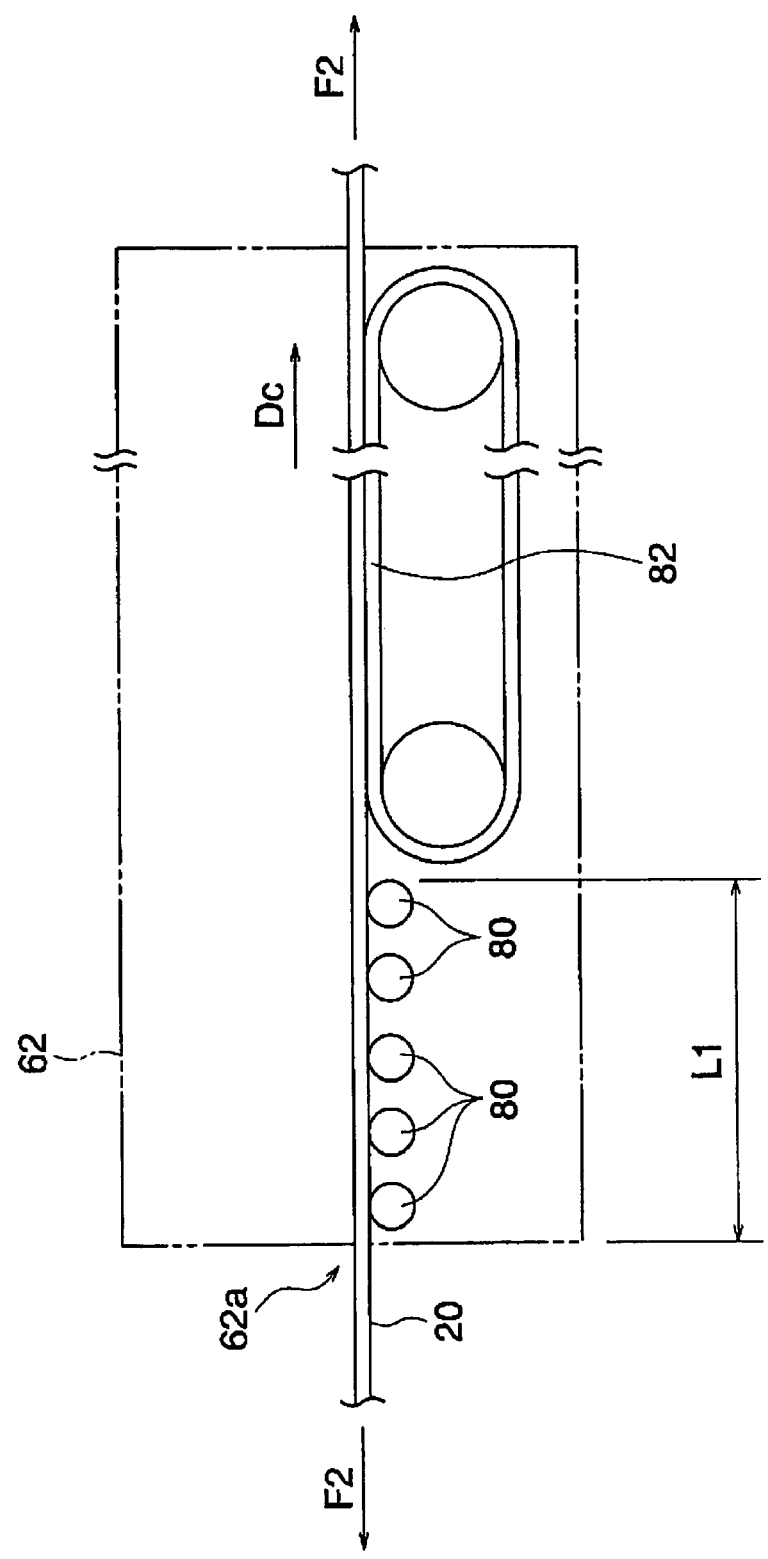
FIG. 6 is an enlarged schematic view of a drying zone according to another embodiment of the present invention.

In this embodiment, as shown in FIG. 6, inside the drying chamber 62, instead of the metal sheet 84, a roller conveyor 80 is provided along a predetermined range of length L1 from the inlet 62a. The roller conveyor 80 has less contact with the sheet 20 compared with a belt conveyor 82 and helps prevent uneven drying. This is confirmed by experiments of the inventors. The rest of the configuration and the action and effect are similar to those of the first embodiment.

Third Embodiment

Figure 7:
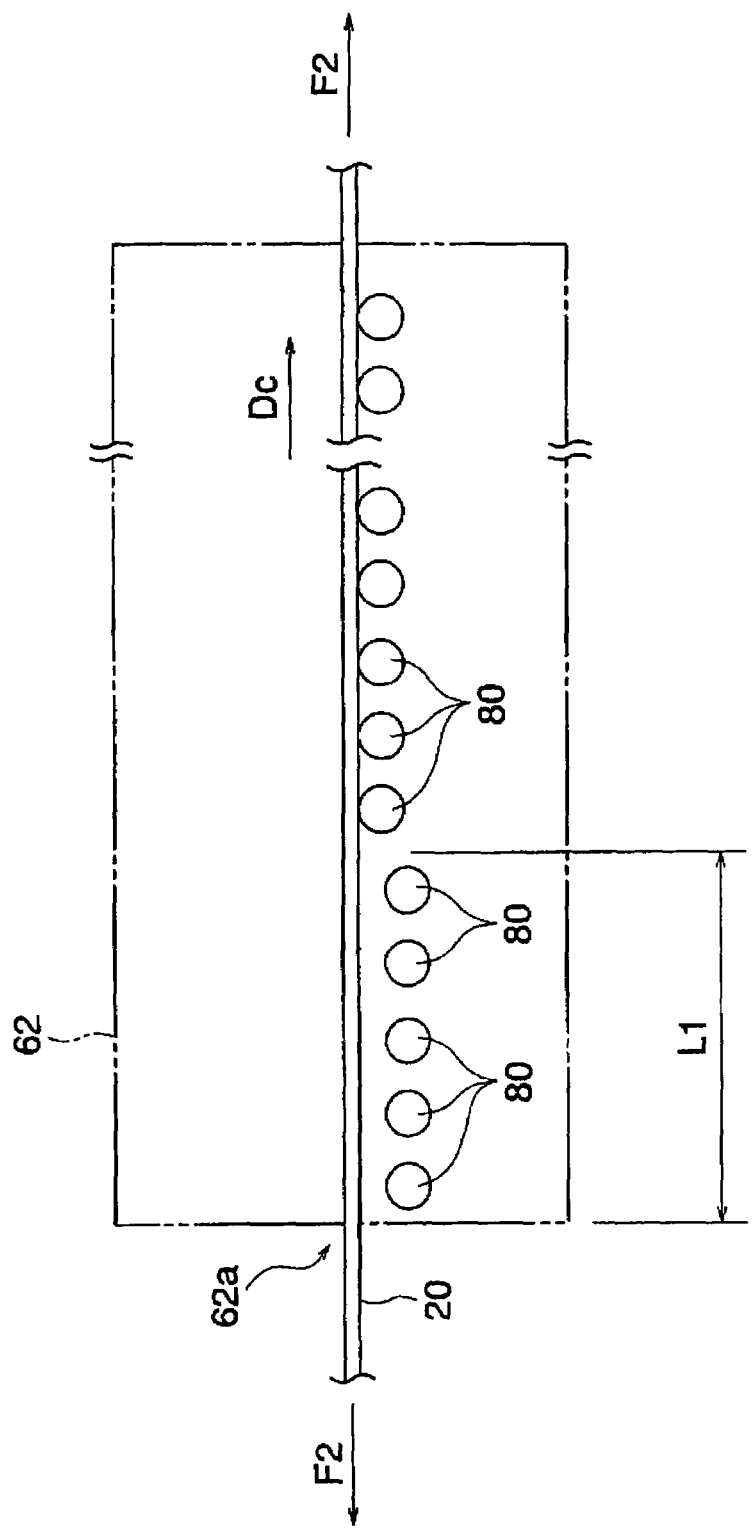
FIG. 7 is an enlarged schematic view of a drying zone according to still another embodiment of the present invention.

Further, the present invention may also be configured as shown in FIG. 7. In this embodiment, inside the drying chamber 62, instead of the belt conveyor 82, a roller conveyor 80 is arranged along the long direction under the sheet 20 and guides the sheet 20 in the continuous feed direction Dc.

In particular, in the present embodiment, not the entire roller conveyor 80 inside the drying chamber 62 contacts the back surface of the sheet 20. At a predetermined range of length L1 from the inlet 62a of the drying chamber 62 to the feed direction Dc, the roller conveyor 80 becomes much lower than the rest of the roller conveyor 80 and does not contact the sheet 20. Alternatively, it is possible to completely eliminate the part of the roller conveyor 80 in this range of length L1. In this embodiment, it is possible to further suppress uneven drying. The rest of the configuration and action and effects are similar to those of the first embodiment.

Fourth Embodiment

Figure 8:
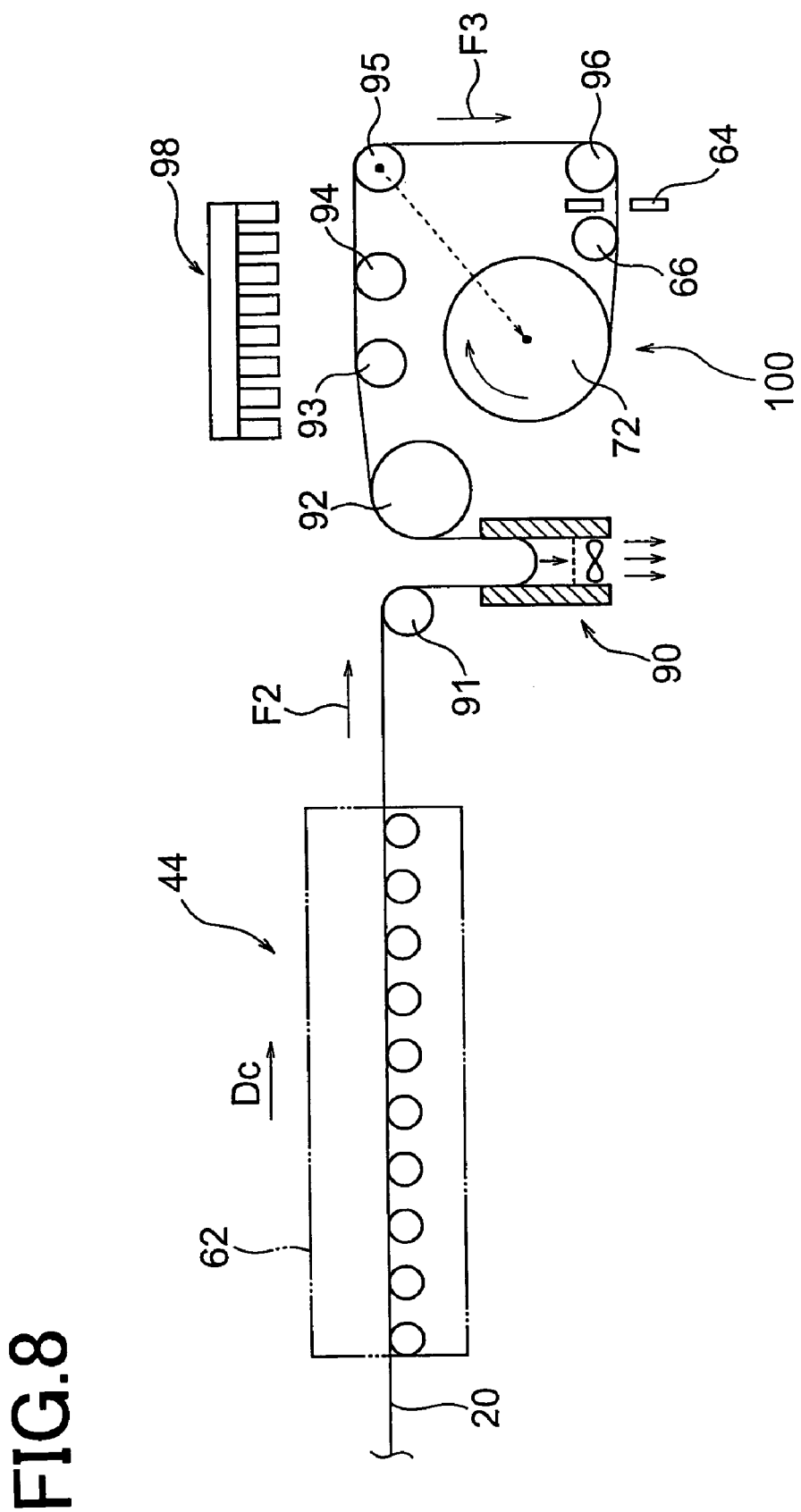
FIG. 8 is an enlarged schematic view of a takeup zone according to still another embodiment of the present invention.

Further, in the present invention, as shown in FIG. 8, the drying zone 44 and the takeup zone 100 are provided between them with a second buffer zone 90. By providing this second buffer zone 90, a third tension F3 different from the second tension F2 given in the drying zone 44 to the support sheet 20 can be given by the takeup zone 100.

The second buffer zone 90 is formed between the tendency roller 91 and the suction roller 92. Between them, the support sheet 20 is held by suction by a suction system so as to hang-downward. The tendency roller 91 turns by a slight force. The second tension is held constant. Due to the presence of the second buffer zone 90, the second tension F2 given to the support sheet 20 in the drying zone 44 is blocked.

The support sheet 20 passing through the suction roller 92 is conveyed over a gum roller 93 and roller 94 where the dust etc. deposited on the back surface of the support sheet 20 are removed. Further, above the gum roller 93 and roller 94, a destaticizer 98 is installed. The surface of the support sheet is blown with destaticizing gas.

The support sheet 20 passing through the destaticizer 98 passes via a tension pickup roller (third tension detecting means) 95 where the third tension F3 acting on the support sheet 20 in the feed direction is detected. The third tension F3 is held in a predetermined range by sending a control signal to the rotation drive system of the takeup roller 72. In the rotation drive system of the takeup roller 72, the third tension F3 is held in a predetermined range by controlling rotation of the takeup roller 72.

The roller 95 and the takeup roller 72 have rollers 96 and 66 provided between them. Through these rollers, the support sheet 20 are taken up on the takeup roller 72. The roller 66 is an EPC drive roller. The EPC detector 64 detects the undulating state of the sheet 20. Based on the results of detection, the roller 66 corrects the undulation of the sheet 20.

When the third tension F3 given at the takeup zone 100 to the support sheet is too low, compared with the case where it is the same as the second tension F2 given in the drying zone 44, and the takeup roller 72 takes up the support sheet 20, buckling, takeup slip, etc. easily occur. Therefore, by giving a third tension F3 different from the second tension F2 given in the drying zone 44 to the support sheet 20 at the takeup zone 100, at the time of takeup of the support sheet 20 by the takeup roller 72, buckling, takeup slip, etc. no longer occur.

In this embodiment, the third tension F3 per unit width of the support sheet 20 is 0.5 to 0.8 N/cm along the support sheet 20 in the long direction. When in this range of tension, buckling, takeup slip, etc. can be prevented at the time of takeup of the support sheet 20 by the takeup roller 72.

Figure 9:
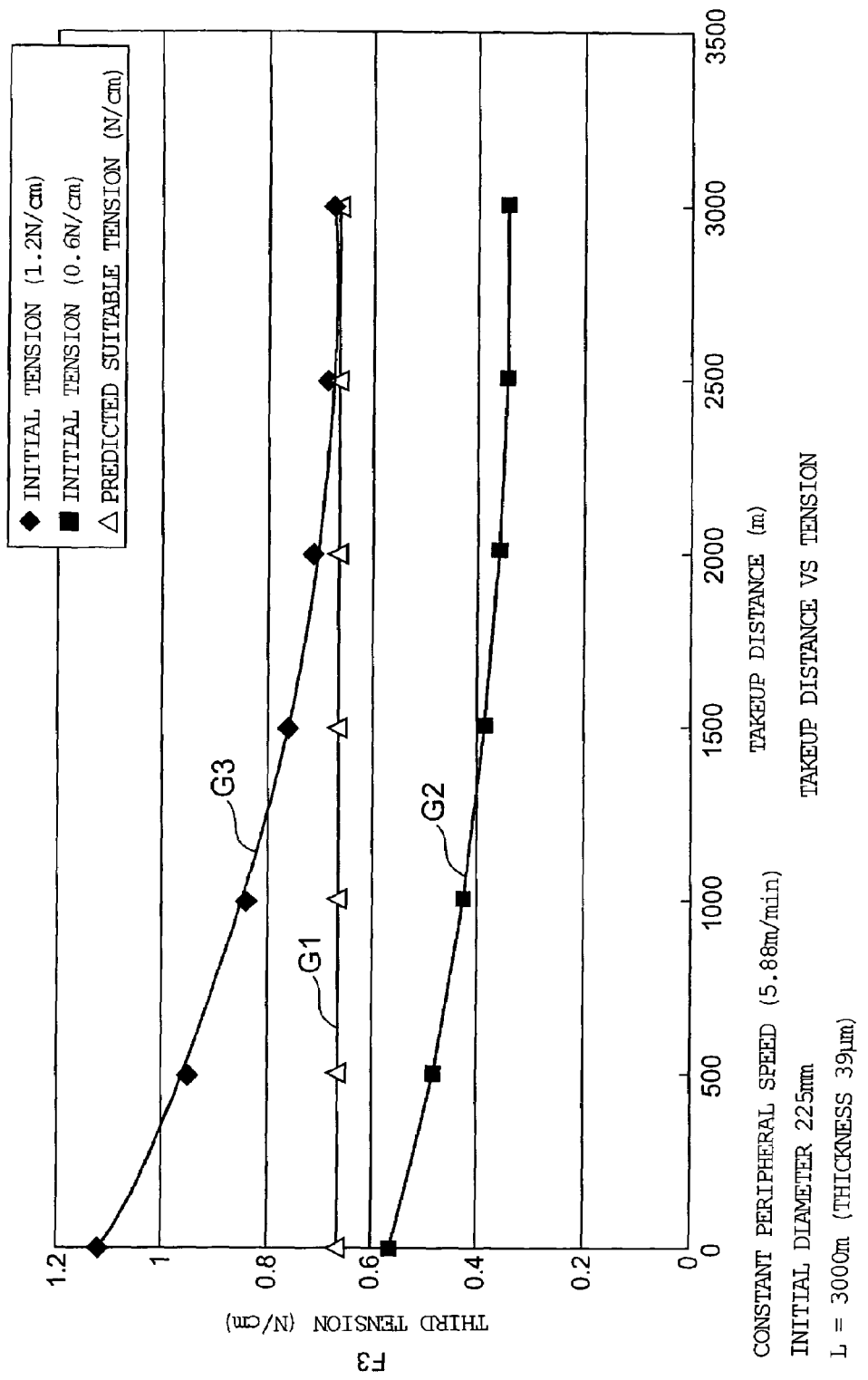
FIG. 9 is a graph showing the relationship between the takeup distance and the takeup tension of the takeup roller shown in FIG. 8.
Figure 10:
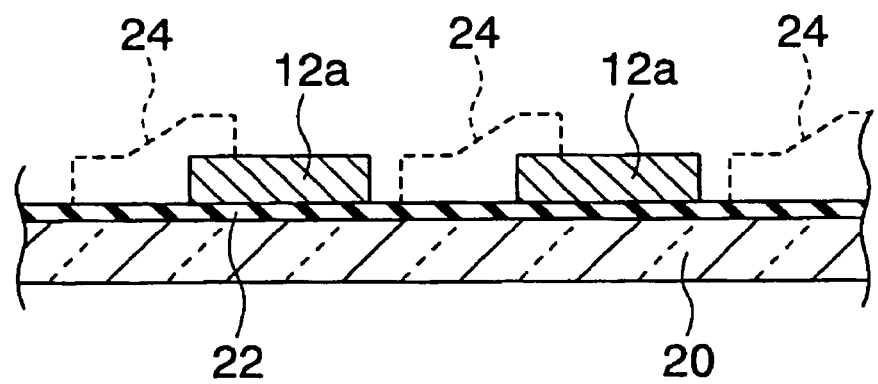
FIG. 10 is a schematic view of electrode and blank patterns showing conventional problems.

Further, in this embodiment, as shown by the graph G1 of FIG. 9, the third tension F3 per unit width of the support sheet 20 is controlled to become substantially constant with regard as to the takeup diameter of the takeup roller 72 (in the graph, the takeup distance). By such control, it is possible to prevent buckling, takeup slip, etc. without regard as to the takeup diameter of the takeup roller.

The rest of the configuration and the action and effects in the present embodiment are similar to the first embodiment. Note that in FIG. 9, the graph G2 shows the change of the third tension F3 (=F2) in the case of not providing the buffer zone 90 shown in FIG. 8 and further not controlling the tension to be constant by the tension pickup roll 95 and takeup roll 72. Further, in FIG. 9, the graph G3 is a graph in the case of setting the initial tension at the graph G2 high.

Note that the present invention is not limited to the above embodiments and can be modified in various ways within the range of the present invention. For example, the method of the present invention is not limited to a method of production of a multilayer ceramic capacitor and can also be applied to a method of production of another multilayer type electronic device.

EXAMPLES

Below, the present invention will be explained based on more detailed examples, but the present invention is not limited to these examples.

Example 1

Into 100 parts by weight of Ni particles of an average particle size of 0.2 μm, a $BaTiO_3$ powder (BT-01/Sakai Chemical Industry) in an amount of 20 parts by weight, an organic vehicle in an amount of 58 parts by weight (polyvinyl butyral resin in an amount of 8 parts by weight dissolved in terpineol in an amount of 92 parts by weight), a plasticizer constituted by bis(2-ethylhexyl)phthalate DOP in an amount of 50 parts by weight, terpineol in an amount of 5 parts by weight, a dispersant in an amount of 1 part by weight, and acetone in an amount of 45 parts by weight were added. A triple roller was used to knead these to a slurry and form an internal electrode paste.

This electrode paste was printed and dried in patterns of the electrode layer 12a on the surface of the support sheet constituted by the carrier sheet 20 using the printer of the printing and drying system 40 shown in FIG. 4.

As the carrier sheet 20, a silicone treated or alkyd treated drawn PET film made by Lintec was used. The sheet 20 had a width of 150 mm and a thickness of 38 μm.

The electrode layer 12a had a thickness after drying of 1 μm. The planar dimensions of the patterns were 1.839×8.004 mm for a rectangular shape. The distance between the patterns was 0.638 mm.

The first tension in the printing zone 42 was 8 N/150 mm (0.53 N/cm), while the second tension in the drying zone 44 (primary printing) was 5.9 N/150 mm (0.39 N/cm). In the drying zone 44, the sheet 20 was fed continuously by a rate of 5.9 m/min in the feed direction Dc, the drying temperature inside the drying chamber 62 was 75° C., and the drying time during which the sheet 20 passed through the drying chamber 62 was 1.5 min.

Next, or in advance, a blank paste for forming the blank patterns was prepared. The ceramic powder sub ingredient additives included in the blank paste were the same as those used for the green sheet paste in the same ratios of formulation.

As the starting material of the ceramic powder, a $BaTiO_3$ powder (BT-02/Sakai Chemical Industry) was used. The ceramic powder sub ingredient additives were prepared to give, with respect to 100 parts by weight of this $BaTiO_3$ powder, $(Ba_{0.6}Ca_{0.4})SiO_3$ in an amount of 1.48 parts by weight, $Y_2O_3$ in an amount of 1.01 parts by weight, $MgCO_3$ in an amount of 0.72 wt %, $Cr_2O_3$ in an amount of 0.13 wt %, and $V_2O_5$ in an amount of 0.045 wt %.

To the ceramic powder and sub ingredient additives (150 g), an ester-based polymer dispersant (1.5 g), terpineol (5 g), acetone (60 g), and a plasticizer constituted by dioctyl phthalate (5 g) were added and mixed over 4 hours. Next, in this mixed solution, a Sekisui Chemical BH6 (polymerization degree: 1450, butyralation degree: 69 mol %±3% polyvinyl butyral resin) in an 8% lacquer (containing, with respect to the total amount of the lacquer, polyvinyl butyral in an amount of 8 wt % and terpineol in an amount of 92 wt %) was added in an amount of 120 g and mixed for 16 hours. Then, the excess solvent acetone was removed and the viscosity was adjusted by adding terpineol in an amount of 40 to 100 g to prepare a blank paste.

Next, this blank paste was printed using the printer of the printing and drying system 40 shown in FIG. 4 on the surface of the carrier sheet 20 formed with the above electrode pattern layer to form a blank pattern layer 24 which was then dried (secondary printing).

The blank pattern layer 24 had a thickness the same as the thickness of the electrode layer 12a. The patterns of the blank pattern layer 24 were patterns complementary with the electrode layer 12a.

The first tension of the printing zone 42 in the secondary printing was similar to that in the primary printing, while the second tension in the drying zone 44 (secondary printing) was the same as that in the primary printing. The rest of the conditions in the secondary printing were similar to those of the primary printing except that the drying temperature was made 90° C.

The deviation of the patterns (feed direction L) between the dried electrode layer 12a and the dried blank pattern layer 24 was measured, whereupon, as shown in Table 1, it was at a maximum −15.8 μm, that is, a small deviation was confirmed. Further, the deviation of the patterns at the dried electrode layer 12a and the dried blank pattern layer 24 in the width direction W perpendicularly intersecting the feed direction was measured, whereupon it was −12.0 μm, that is, a small deviation was confirmed.

Note that the deviation of patterns of the dried electrode layer 12a and the dried blank pattern layer 24 (maximum overlap deviation) indicates the deviation of patterns between the primary printing and secondary printing. This is equal to the deviation in primary printing with respect to the design patterns.

Further, the deviation of patterns of the dried blank pattern layer (secondary printing) 24 with respect to the design patterns (feed direction L) was measured, whereupon, as shown in Table 1, it was at a maximum −19.2 μm, that is, a small deviation was confirmed. Further, the deviation of patterns of the blank pattern layer 24 with respect to the design dimensions in the width direction W perpendicularly intersecting the feed direction was measured, whereupon it was 2.7 μm, that is, a small deviation was confirmed.

Note that the deviation of patterns of the dried blank pattern layer 24 with respect to the design dimensions (maximum dimensional deviation) shows the pattern precision. This means the final dimension deviation.

TABLE 1

|  | Base material thickness (μm) | Primary printing second tension (N/cm) | Secondary printing second tension (N/cm) | *Maximum overlap deviation [primary and secondary deviation (design vs primary deviation)] | | ** Pattern precision (maximum dimensional deviation) [final dimensional deviation (design vs secondary deviation)] | | Occurrence of bending | Breakage defects |
|---|---|---|---|---|---|---|---|---|---|
|  |  |  |  | W direction (μm) | L direction (μm) | W direction (μm) | L direction (μm) |  |  |
| Comp. Ex. 1 | 38 | 0.00 | 0.00 | 20.5 | −38.2 | 18.1 | −40.3 | Poor | Good |
| Ex. 1 |  | 0.39 | 0.39 | −12.0 | −15.8 | 2.7 | −19.2 | Good | Good |
| Ex. 2 |  | 0.67 | 0.67 | −2.4 | 0.6 | 12.1 | 6.8 | Good | Good |
| Ex. 3 |  | 1.22 | 1.22 | −8.4 | 20.3 | 22.5 | 43.6 | Good | Good |
| Ref. ex. 1 |  | 1.77 | 1.77 | −27.7 | 44.0 | 46.7 | 86.2 | Poor | Good |
| Ref. ex. 2 |  | 2.33 | 2.33 | −37.3 | 59.3 | 59.9 | 129.3 | Poor | Poor |
| Comp. ex. 2 | 16 | 0.00 | 0.00 | 41.1 | −88.7 | 98.7 | −125.0 | Poor | Poor |
| Ex. 5 |  | 0.16 | 0.16 | 34.3 | 9.6 | 32.9 | 24.0 | Good | Good |
| Ref. ex. 3 |  | 0.39 | 0.39 | 37.4 | 63.4 | 87.7 | 103.5 | Poor | Poor |
| Ref. ex. 4 |  | 0.67 | 0.67 | 50.7 | 178.2 | 183.8 | 196.4 | Poor | Poor |
| Ref. ex. 5 |  | 1.22 | 1.22 | 58.9 | 348.7 | 311.3 | 422.9 | Poor | Poor |

Green Sheet Paste

Next, or beforehand, a green sheet paste was prepared. That is, as the starting material of the ceramic powder, a $BaTiO_3$ powder (BT-02/Sakai Chemical Industry) was used. The ceramic powder sub ingredient additives were prepared to give, with respect to 100 parts by weight of this $BaTiO_3$ powder, $(Ba_{0.6}Ca_{0.4})SiO_3$ in an amount of 1.48 parts by weight, $Y_2O_3$ in an amount of 1.01 parts by weight, $MgCO_3$ in an amount of 0.72 wt %, $Cr_2O_3$ in an amount of 0.13 wt %, and $V_2O_5$ in an amount of 0.045 wt %.

First, only the sub ingredient additives were mixed by a ball mill to a slurry. That is, the sub ingredient additives (total weight of 8.8 g) and a solvent with an ethanol/n-propanol ratio of 1:1 (16 g) were pre-crushed by a ball mill for 20 hours. Next, to the $BaTiO_3$ in an amount of 191.2 g, the pre-crushed slurry of the sub ingredient additives, ethanol in an amount of 38 g, n-propanol in an amount of 38 g, xylene in an amount of 28 g, mineral spirits in an amount of 14 g, a plasticizer ingredient constituted by DOP (dioctyl phthalate) in an amount of 6 g, and a dispersant constituted by a polyethylene glycol-based nonionic dispersant (HLB=5 to 6) in an amount of 1.4 g were added and mixed by a ball mill for 4 hours. Note that as the dispersant constituted by the polyethylene glycol-based nonionic dispersant (HLB=5 to 6), a polyethylene glycol and fatty acid ester block polymer was used.

Next, to this dispersion paste, as a binder resin, a Sekisui Chemical BH6 (polyvinyl butyral resin/PVB) in a 15% lacquer (Sekisui Chemical BH6 dissolved in ethanol/n-propanol=1:1) was added in an amount, as solid content, of 6 wt % (amount of lacquer added, 80 g). After this, this was mixed for 16 hours by a ball mill to obtain a ceramic paste (green sheet paste).

The binder resin constituted by the polyvinyl butyral resin had a polymerization degree of 1400, the butyralation degree was 69%±3%, and the amount of residual acetyl groups was 3±2%. This binder resin was contained in the ceramic paste in an amount of 6 parts by weight with respect to 100 parts by weight of the ceramic powder (including ceramic powder sub ingredient additives). Further, when the total volume of the ceramic powder, binder resin, and plasticizer in the ceramic paste was 100 vol %, the percent voltage of the ceramic powder was 67.31 vol %. Further, the percent weight of the ceramic powder in the paste as a whole was 49 wt %.

Further, the plasticizer constituted by the DOP was included in the ceramic paste in an amount of 50 parts by weight with respect to 100 parts by weight of the binder resin.

Water was included in an amount of 2 parts by weight with respect to 100 parts by weight of the ceramic powder. The dispersant constituted by the polyethylene glycol-based nonionic dispersant was contained in an amount of 0.7 part by weight with respect to 100 parts by weight of the ceramic powder.

Further, the paste had added to it, with respect to 100 parts by weight of the ceramic powder, at least one mineral spirit from among hydrocarbon-based solvents, industrial use gasoline, kerosene, and solvent naphtha in an amount of 5 parts by weight. Further, the paste contained, as a solvent, an alcohol-based solvent and an aromatic-based solvent and contained, with respect to the total weight of the alcohol-based solvent and aromatic-based solvent as 100 parts by weight, an aromatic-based solvent constituted by toluene in an amount of 15 parts by weight.

The thus obtained paste was coated by a wire bar coater on the support film shown in FIG. 3(A) constituted by a PET film to a thickness of 1 μm and dried so as to prepare a green sheet 10a. The coating rate was 4 m/min, the drying conditions were a temperature in the drying oven of 60° C. to 70° C., and the drying time was 2 min.

Release Layer Paste

Other than making the $BaTiO_3$ in the green sheet paste BT-01, the same procedure was followed as with the green sheet paste to prepare a paste. That paste was diluted 5-fold by a mixed solvent of ethanol:propanol:xylene (42.5:42.5:15). This was used as the release layer paste.

Bonding Layer Paste

As the bonding layer paste, an organic vehicle was used. Specifically, a mixed solution of a polyvinyl butyral resin in an amount of 100 parts by weight and a plasticizer constituted by bis(2-ethylhexyl)phthalate DOP in 50 parts by weight and MEK in 900 parts by weight was further diluted 10-fold by MEK for use as the bonding layer paste.

Formation of Green Sheet and Transfer of Bonding Layer and Electrode Layer

First, the above dielectric green sheet paste was coated on a PET film (second support sheet) using a wire bar coater to a thickness of 1 μm to form a green sheet. Next, another PET film (first support sheet) was coated with the above release layer paste by a wire bar coater and dried to form a 0.2 μm release layer.

The release layer was formed on its surface, as explained above, with the electrode layer 12a and blank pattern layer 24.

Further, another PET film (third support sheet) was formed with a bonding layer 28. The bonding layer 28 was formed to a thickness of 0.1 μm using the above bonding layer paste by a wire bar coater.

First, the surface of the electrode layer 12a and blank pattern layer 24 were transferred the bonding layer 28 by the method shown in FIG. 2. At the time of transfer, a pair of rollers was used. The pressing force was 1 MPa, and the temperature was 80° C. It could be confirmed that the transfer was performed well.

Next, by the method shown in FIG. 3, the internal electrode layer 12a and blank pattern layer 24 were bonded (transferred) to the surface of the green sheet 10a via the bonding layer 28. At the time of transfer, a pair of rollers was used. The pressing force was 1 MPa, and the temperature was 80° C. It could be confirmed that the transfer was performed well.

Evaluation of Stack Chip

Next, a succession of internal electrode layers 12a and green sheets 10a were stacked. In the end, 100 internal electrode layers 12a (blank pattern layers 24) were stacked. After this, in accordance with the design dimensions, the stack was cut into the individual chips. The cross-section of each cut stack chip was observed. As a result, in Example 1, as shown in Table 1, there was no bending at the ends of the internal electrode layers 12a and further there were no disconnection defects. In Table 1, no bending was evaluated as "good", while bending was evaluated as "poor". Further, regarding disconnection defects, no disconnection defects was evaluated as "good", while disconnection defects were evaluated as "poor".

Note that "bending" is the phenomenon where the ends of the internal electrode layers 12a are bent, connection with other internal electrode layers 12a adjoining them in the stacking direction ends up occurring, and short-circuits are caused. Further, a "disconnection defect" is the phenomenon where deviation of patterns results in cutting not at suitable positions of the drawn margins, but cutting at unsuitable positions and electrode ends originally not exposed ending up being exposed at the side ends of the stack chips. This also becomes a cause of short-circuits.

In this Example 1, as the primary printing, the internal electrode layer 12a was printed and dried, then the blank pattern layer 24 was printed and dried, but even if the order is reversed, it is predicted that the same effects will be obtained.

Comparative Example 1

Except for making the second tension F2 in the primary printing and secondary printing 0, the same procedure was followed as in Example 1 to print and dry the electrode layer 12a and blank pattern layer 24. The result was evaluated in the same way as Example 1. The results are shown in Table 1.

Example 2

Except for making the second tension F2 in the primary printing and secondary printing 10.0 N/150 mm (0.67 N/cm), the same procedure was followed as in Example 1 to print and dry the electrode layer 12a and blank pattern layer 24. The result was evaluated in the same way as Example 1. The results are shown in Table 1.

Example 3

Except for making the second tension F2 in the primary printing and secondary printing 18.3 N/150 mm (1.22 N/cm), the same procedure was followed as in Example 1 to print and dry the electrode layer 12a and blank pattern layer 24. The result was evaluated in the same way as Example 1. The results are shown in Table 1.

Reference Example 1

Except for making the second tension F2 in the primary printing and secondary printing 26.5 N/150 mm (1.77 N/cm), the same procedure was followed as in Example 1 to print and dry the electrode layer 12a and blank pattern layer 24. The result was evaluated in the same way as Example 1. The results are shown in Table 1.

Reference Example 2

Except for making the second tension F2 in the primary printing and secondary printing 35.0 N/150 mm (2.33 N/cm), the same procedure was followed as in Example 1 to print and dry the electrode layer 12a and blank pattern layer 24. The result was evaluated in the same way as Example 1. The results are shown in Table 1.

Example 5

Except for making the thickness of the printing base material constituted by the carrier sheet 20 16 μm and making the second tension F2 in the primary printing and secondary printing 2.5 N/150 mm (0.16 N/cm), the same procedure was followed as in Example 1 to print and dry the electrode layer 12a and blank pattern layer 24. The result was evaluated in the same way as Example 1. The results are shown in Table 1.

Comparative Example 2

Except for making the thickness of the printing base material constituted by the carrier sheet 20 16 μm and making the second tension F2 in the primary printing and secondary printing 0 N/150 mm (0 N/cm), the same procedure was followed as in Example 1 to print and dry the electrode layer 12a and blank pattern layer 24. The result was evaluated in the same way as Example 1. The results are shown in Table 1.

Reference Example 3

Except for making the thickness of the printing base material constituted by the carrier sheet 20 16 μm and making the second tension F2 in the primary printing and secondary printing 5.9 N/150 mm (0.39 N/cm), the same procedure was followed as in Example 1 to print and dry the electrode layer 12a and blank pattern layer 24. The result was evaluated in the same way as Example 1. The results are shown in Table 1.

Reference Example 4

Except for making the thickness of the printing base material constituted by the carrier sheet 20 16 μm and making the second tension F2 in the primary printing and secondary printing 10.0 N/1150 mm (0.67 N/cm), the same procedure was followed as in Example 1 to print and dry the electrode layer 12a and blank pattern layer 24. The result was evaluated in the same way as Example 1. The results are shown in Table 1.

Reference Example 5

Except for making the thickness of the printing base material constituted by the carrier sheet 20 16 μm and making the second tension F2 in the primary printing and secondary printing 18.3 N/150 ml (1.22 N/cm), the same procedure was followed as in Example 1 to print and dry the electrode layer 12a and blank pattern layer 24. The result was evaluated in the same way as Example 1. The results are shown in Table 1.

Evaluation 1

As shown in Table 1, depending on the thickness of the carrier sheet 20 (base material sheet thickness), the optimal values of the second tension F2 in the primary printing and secondary printing vary, but compared with Comparative Examples 1 and 2 where the second tension becomes 0 in both the primary printing and secondary printing, in Examples 1 to 6, it was learned that there was little deviation in maximum overlap and deviation in pattern precision in both the W direction and L direction. Further, in the examples, there were no bending and no disconnection defects.

Note that from the results of Table 1, it was confirmed that giving both the primary printing and secondary printing second tensions of substantially the same extent is superior in terms of pattern precision than the case of making the second tension 0 at only the time of the secondary printing. Further, from the results of Table 1, it was confirmed that a second tension of 0.16 to 1.22 N/cm is preferable.

The invention claimed is:

1. A printing and drying method comprising:
   laying a support sheet elongated in a long direction of said support sheet so as to bridge both a printing zone and a drying zone,
   giving a first tension along said support sheet and in that state printing predetermined patterns on the support sheet in said printing zone,
   feeding the support sheet toward said drying zone, and
   giving a second tension along the support sheet printed with the predetermined patterns in said drying zone and in that state drying in a drying chamber, wherein
   said first tension and second tension are given by separate tension giving means,
   said second tension is set to be able to prevent shrinkage of the support sheet in the long direction while passing through the drying zone, and
   configuring so that a metal sheet contacts said support sheet in a predetermined range of length from the inlet of said drying zone toward the inside of the drying zone.

2. The printing and drying method as set forth in claim 1, wherein said first tension is set not allowing said support sheet to wrinkle.

3. The printing and drying method as set forth in claim 1, wherein said second tension is 0.16 to 1.22 N/cm along the long direction of the support sheet, when the second tension is measured per unit width of the support sheet.

4. The printing and drying method as set forth in claim 1, wherein in said drying zone, the second tension given the support sheet positioned in the drying zone is detected and said second tension is controlled to be held constant.

5. The printing and drying method as set forth in claim 1, wherein
   a first buffer zone is provided between said printing zone and drying zone, and,
   in that first buffer zone, said support sheet is given slack so as to allow index feeding of said support sheet in said printing zone and continuous feeding of said support sheet in said drying zone.

6. The printing and drying method as set forth in claim 1, wherein when designating the glass transition temperature of the synthetic resin forming said support sheet as Tg, in said drying zone, said support sheet is exposed to a temperature of $\{Tg-15\}°$ C. or more and further a temperature of $\{Tg+25\}°$ C. or less.

7. The printing and drying method as set forth in claim 6, wherein, in said drying zone, said support sheet is exposed to a temperature environment of 70 to 100° C.

8. The printing and drying method as set forth in claim 1, wherein said support sheet is a drawn synthetic resin sheet.

9. The printing and drying method as set forth in claim 8, wherein said support sheet is comprised of polyethylene terephthalate.

* * * * *